United States Patent
Katrak

(10) Patent No.: US 7,725,782 B2
(45) Date of Patent: May 25, 2010

(54) LINKED RANDOM ACCESS MEMORY (RAM) INTERLEAVED PATTERN PERSISTENCE STRATEGY

(75) Inventor: Kerfegar K. Katrak, Fenton, MI (US)

(73) Assignee: GM Global Technology Operations, Inc., Detroit, MI (US)

(*) Notice: Subject to any disclaimer, the term of this patent is extended or adjusted under 35 U.S.C. 154(b) by 711 days.

(21) Appl. No.: 11/619,626

(22) Filed: Jan. 4, 2007

(65) Prior Publication Data

US 2008/0168317 A1 Jul. 10, 2008

(51) Int. Cl.
*G11C 29/00* (2006.01)

(52) U.S. Cl. ............... 714/718; 714/738; 714/724; 714/5; 714/42; 714/736; 714/719; 714/720; 365/201

(58) Field of Classification Search .............. None
See application file for complete search history.

(56) References Cited

U.S. PATENT DOCUMENTS

| | | | | |
|---|---|---|---|---|
| 4,195,770 A * | 4/1980 | Benton et al. | ............... | 714/719 |
| 5,357,521 A * | 10/1994 | Cheng et al. | ............... | 714/720 |
| 6,345,372 B1 * | 2/2002 | Dieckmann et al. | ......... | 714/720 |
| 6,499,126 B1 * | 12/2002 | Tsuto | ............... | 714/738 |
| 6,513,138 B1 * | 1/2003 | Ohsawa | ............... | 714/738 |
| 6,601,204 B1 * | 7/2003 | Tsuto | ............... | 714/739 |
| 6,601,205 B1 * | 7/2003 | Lehmann et al. | ............ | 714/741 |
| 6,769,083 B1 * | 7/2004 | Tsuto et al. | ................. | 714/738 |
| 7,286,950 B2 * | 10/2007 | Ozora et al. | ............... | 702/108 |
| 2006/0161829 A1 * | 7/2006 | Kobayashi | .................. | 714/738 |
| 2006/0190794 A1 * | 8/2006 | Murata | ....................... | 714/742 |
| 2007/0168808 A1 * | 7/2007 | Ong | ............................ | 714/731 |

* cited by examiner

*Primary Examiner*—John P Trimmings
(74) *Attorney, Agent, or Firm*—Ingrassia Fisher & Lorenz, P.C.

(57) ABSTRACT

A method and apparatus is provided for detecting random access memory (RAM) failure for data with a plurality of addresses. The method comprises generating a plurality of RAM test patterns in a predetermined order, implementing a RAM test pattern on each data address in an initial testing pass, based on the predetermined order of the RAM test patterns, rotating the RAM test patterns sequentially to prepare for a new testing pass, and implementing the RAM test patterns on different data addresses in the new testing pass. The apparatus comprises means for generating a plurality of RAM test patterns in a predetermined order, means for implementing a RAM test pattern on each data address in an initial testing pass, based on the predetermined order of the RAM test patterns, means for rotating the RAM test patterns sequentially to prepare for a new testing pass, and means for implementing the RAM test patterns on different data addresses in the new testing pass.

20 Claims, 8 Drawing Sheets

| P#1 ADDR. | P#2 ADDR. | P#3 ADDR. | P#4 ADDR. | P#5 ADDR. | P#6 ADDR. | P#7 ADDR. | P#8 ADDR. | P#9 ADDR. | P#10 ADDR. | P#11 ADDR. | P#12 ADDR. | 28-31 HEX | 24-27 HEX | 20-23 HEX | 16-19 HEX | 12-15 HEX | 8-11 HEX | 4-7 HEX | 0-3 HEX |
|---|---|---|---|---|---|---|---|---|---|---|---|---|---|---|---|---|---|---|---|
| x0 | x11 | x10 | x9 | x8 | x7 | x6 | x5 | x4 | x3 | x2 | x1 | 5 | 5 | 5 | 5 | 5 | 5 | 5 | 5 |
| x1 | x0 | x11 | x10 | x9 | x8 | x7 | x6 | x5 | x4 | x3 | x2 | 3 | 3 | 3 | 3 | 3 | 3 | 3 | 3 |
| x2 | x1 | x0 | x11 | x10 | x9 | x8 | x7 | x6 | x5 | x4 | x3 | 6 | 6 | 6 | 6 | 6 | 6 | 6 | 6 |
| x3 | x2 | x1 | x0 | x11 | x10 | x9 | x8 | x7 | x6 | x5 | x4 | F | 0 | F | F | 0 | 0 | F | 0 |
| x4 | x3 | x2 | x1 | x0 | x11 | x10 | x9 | x8 | x7 | x6 | x5 | 0 | 0 | F | 0 | 0 | 0 | F | F |
| x5 | x4 | x3 | x2 | x1 | x0 | x11 | x10 | x9 | x8 | x7 | x6 | F | F | F | 0 | 0 | 0 | 0 | 0 |
| x6 | x5 | x4 | x3 | x2 | x1 | x0 | x11 | x10 | x9 | x8 | x7 | 0 | 0 | 0 | F | F | F | F | F |
| x7 | x6 | x5 | x4 | x3 | x2 | x1 | x0 | x11 | x10 | x9 | x8 | F | F | F | 0 | F | F | 0 | 0 |
| x8 | x7 | x6 | x5 | x4 | x3 | x2 | x1 | x0 | x11 | x10 | x9 | 0 | 0 | 0 | F | 0 | 0 | 0 | F |
| x9 | x8 | x7 | x6 | x5 | x4 | x3 | x2 | x1 | x0 | x11 | x10 | 9 | 9 | 9 | 9 | 9 | 9 | 9 | 9 |
| x10 | x9 | x8 | x7 | x6 | x5 | x4 | x3 | x2 | x1 | x0 | x11 | C | C | C | C | C | C | C | C |
| x11 | x10 | x9 | x8 | x7 | x6 | x5 | x4 | x3 | x2 | x1 | x0 | A | A | A | A | A | A | A | A |

START-UP RAM TEST ORDERED PATTERNS

*FIG. 3*

WORD STRUCTURE BASED START-UP RAM TEST

| P#1 ADDR. | P#2 ADDR. | P#3 ADDR. | P#4 ADDR. | P#5 ADDR. | P#6 ADDR. | P#7 ADDR. | P#8 ADDR. | P#9 ADDR. | P#10 ADDR. | 12-15 HEX | 8-11 HEX | 4-7 HEX | 0-3 HEX |
|---|---|---|---|---|---|---|---|---|---|---|---|---|---|
| x0 | x9 | x8 | x7 | x6 | x5 | x4 | x3 | x2 | x1 | 5 | 5 | 5 | 5 |
| x1 | x0 | x9 | x8 | x7 | x6 | x5 | x4 | x3 | x2 | 3 | 3 | 3 | 3 |
| x2 | x1 | x0 | x9 | x8 | x7 | x6 | x5 | x4 | x3 | 6 | 6 | 6 | 6 |
| x3 | x2 | x1 | x0 | x9 | x8 | x7 | x6 | x5 | x4 | F | 0 | F | 0 |
| x4 | x3 | x2 | x1 | x0 | x9 | x8 | x7 | x6 | x5 | 0 | 0 | F | F |
| x5 | x4 | x3 | x2 | x1 | x0 | x9 | x8 | x7 | x6 | F | F | 0 | 0 |
| x6 | x5 | x4 | x3 | x2 | x1 | x0 | x9 | x8 | x7 | 0 | 9 | 0 | 0 |
| x7 | x6 | x5 | x4 | x3 | x2 | x1 | x0 | x9 | x8 | 9 | 9 | 9 | 9 |
| x8 | x7 | x6 | x5 | x4 | x3 | x2 | x1 | x0 | x9 | C | C | C | C |
| x9 | x8 | x7 | x6 | x5 | x4 | x3 | x2 | x1 | x0 | A | A | A | A |

FIG. 4

BYTE STRUCTURE BASED START-UP RAM TEST ← 26

| P#1 ADDR. | P#2 ADDR. | P#3 ADDR. | P#4 ADDR. | P#5 ADDR. | P#6 ADDR. | P#7 ADDR. | P#8 ADDR. | 4-7 HEX | 0-3 HEX |
|---|---|---|---|---|---|---|---|---|---|
| x0 | x7 | x6 | x5 | x4 | x3 | x2 | x1 | 5 | 5 |
| x1 | x0 | x7 | x6 | x5 | x4 | x3 | x2 | 3 | 3 |
| x2 | x1 | x0 | x7 | x6 | x5 | x4 | x3 | 6 | 6 |
| x3 | x2 | x1 | x0 | x7 | x6 | x5 | x4 | F | 0 |
| x4 | x3 | x2 | x1 | x0 | x7 | x6 | x5 | 0 | F |
| x5 | x4 | x3 | x2 | x1 | x0 | x7 | x6 | 9 | 9 |
| x6 | x5 | x4 | x3 | x2 | x1 | x0 | x7 | C | C |
| x7 | x6 | x5 | x4 | x3 | x2 | x1 | x0 | A | A |

*FIG. 5*

BYTE STRUCTURE BASED START-UP RAM TEST ← 26

| P#1 ADDR. | P#2 ADDR. | P#3 ADDR. | P#4 ADDR. | P#5 ADDR. | P#6 ADDR. | P#7 ADDR. | P#8 ADDR. | P#8 ADDR. | 4-7 HEX | 0-3 HEX |
|---|---|---|---|---|---|---|---|---|---|---|
| x0 | x8 | x7 | x6 | x5 | x4 | x3 | x2 | x1 | 5 | 5 |
| x1 | x0 | x8 | x7 | x6 | x5 | x4 | x3 | x2 | 3 | 3 |
| x2 | x1 | x0 | x8 | x7 | x6 | x5 | x4 | x3 | 6 | 6 |
| x3 | x2 | x1 | x0 | x8 | x7 | x6 | x5 | x4 | F | 0 |
| x4 | x3 | x2 | x1 | x0 | x8 | x7 | x6 | x5 | 0/F | 0/F |
| x5 | x4 | x3 | x2 | x1 | x0 | x8 | x7 | x6 | 0 | 0 |
| x6 | x5 | x4 | x3 | x2 | x1 | x0 | x8 | x7 | 9 | 9 |
| x7 | x6 | x5 | x4 | x3 | x2 | x1 | x0 | x8 | C | C |
| x8 | x7 | x6 | x5 | x4 | x3 | x2 | x1 | x0 | A | A |

*FIG. 6*

ENHANCED RAM TEST COMPLEMENTARY PATTERNS — 54

| | 12-15 HEX | 8-11 HEX | 4-7 HEX | 0-3 HEX | 12-15 HEX | 8-11 HEX | 4-7 HEX | 0-3 HEX |
|---|---|---|---|---|---|---|---|---|
| x0 | 5 | 5 | 5 | 5 | 5 | 5 | 5 | 5 |
| x1 | A | A | A | A | A | A | A | A |
| x2 | 9 | 9 | 9 | 9 | 9 | 9 | 9 | 9 |
| x3 | 6 | 6 | 6 | 6 | 6 | 6 | 6 | 6 |
| x4 | 3 | 3 | 3 | 3 | 3 | 3 | 3 | 3 |
| x5 | C | C | C | C | C | C | C | C |
| x6 | F | 0 | F | 0 | F | 0 | F | 0 |
| x7 | 0 | F | 0 | F | 0 | F | 0 | F |
| x8 | 0 | 0 | F | F | 0 | 0 | F | F |
| x9 | F | F | 0 | 0 | F | F | 0 | 0 |
| x10 | F | F | F | F | 0 | 0 | 0 | 0 |
| x11 | 0 | 0 | 0 | 0 | F | F | F | F |

FIG. 8

WORD STRUCTURE BASED START-UP RAM TEST — 54

| 15 14 13 12 | 11 10 9 8 | 7 6 5 4 | 3 2 1 0 | 12-15 HEX | 8-11 HEX | 4-7 HEX | 0-3 HEX | |
|---|---|---|---|---|---|---|---|---|
| 0 1 0 1 | 0 1 0 1 | 0 1 0 1 | 0 1 0 1 | 5 | 5 | 5 | 5 | x0 |
| 1 0 1 0 | 1 0 1 0 | 1 0 1 0 | 1 0 1 0 | A | A | A | A | x1 |
| 1 1 1 1 | 0 0 0 0 | 1 1 1 1 | 0 0 0 0 | F | 0 | F | 0 | x2 |
| 0 0 0 0 | 1 1 1 1 | 0 0 0 0 | 1 1 1 1 | 0 | F | 0 | F | x3 |
| 0 0 0 0 | 0 0 0 0 | 1 1 1 1 | 1 1 1 1 | 0 | 0 | F | F | x4 |
| 1 1 1 1 | 1 1 1 1 | 0 0 0 0 | 0 0 0 0 | F | F | 0 | 0 | x5 |
| 1 0 0 1 | 1 0 0 1 | 1 0 0 1 | 1 0 0 1 | 9 | 9 | 9 | 9 | x6 |
| 0 1 1 0 | 0 1 1 0 | 0 1 1 0 | 0 1 1 0 | 6 | 6 | 6 | 6 | x7 |
| 0 0 1 1 | 0 0 1 1 | 0 0 1 1 | 0 0 1 1 | 3 | 3 | 3 | 3 | x8 |
| 1 1 0 0 | 1 1 0 0 | 1 1 0 0 | 1 1 0 0 | C | C | C | C | x9 |

FIG. 9

LongWORD STRUCTURE BASED ENHANCED RAM TEST — 54

| | 12-15 HEX | 8-11 HEX | 4-7 HEX | 0-3 HEX | 12-15 HEX | 8-11 HEX | 4-7 HEX | 0-3 HEX |
|---|---|---|---|---|---|---|---|---|
| x0 | 5 | 5 | 5 | 5 | 5 | 5 | 5 | 5 |
| x1 | A | A | A | A | A | A | A | A |
| x2 | F | 0 | F | 0 | F | 0 | F | 0 |
| x3 | 0 | F | 0 | F | 0 | F | 0 | F |
| x4 | 0 | 0 | F | F | 0 | 0 | F | F |
| x5 | F | F | 0 | 0 | F | F | 0 | 0 |
| x6 | F | F | F | F | 0 | 0 | 0 | 0 |
| x7 | 0 | 0 | 0 | 0 | F | F | F | F |
| x8 | 9 | 9 | 9 | 9 | 9 | 9 | 9 | 9 |
| x9 | 6 | 6 | 6 | 6 | 6 | 6 | 6 | 6 |
| x10 | 3 | 3 | 3 | 3 | 3 | 3 | 3 | 3 |
| x11 | C | C | C | C | C | C | C | C |

FIG. 10

BYTE STRUCTURE BASED ENHANCED RAM TEST — 54

| 4-7 HEX | 0-3 HEX |
|---|---|
| 5 | 5 |
| A | A |
| F | 0 |
| 0 | F |
| 9 | 9 |
| 6 | 6 |
| 3 | 3 |
| C | C |

FIG. 11

LINKED RANDOM ACCESS MEMORY (RAM) INTERLEAVED PATTERN PERSISTENCE STRATEGY

TECHNICAL FIELD

The present invention generally relates to control systems found on automobiles and other vehicles, and more particularly relates to methods and systems for ensuring the security of data processed within a vehicle-based control system.

BACKGROUND OF THE INVENTION

Modern automobiles and other vehicles commonly include sophisticated on-board computer systems that monitor the status and performance of various components of the vehicle (for example, the vehicle engine, transmission, brakes, suspension, and/or other components of the vehicle). Many of these computer systems may also adjust or control one or more operating parameters of the vehicle in response to operator instructions, road or weather conditions, operating status of the vehicle, and/or other factors.

Various types of microcontroller or microprocessor-based controllers found on many conventional vehicles may include supervisory control modules (SCMs), engine control modules (ECMs), controllers for various vehicle components (for example, anti-lock brakes, electronically-controlled transmissions, or other components), among other modules. Such controllers are typically implemented with any one of numerous types of microprocessors, microcontrollers, or other control devices that appropriately receive data from one or more sensors or other sources, process the data to create suitable output signals, and provide the output signals to control actuators, dashboard indicators and/or other data responders as appropriate. The various components of a vehicle-based control system typically inter-communicate with each other and/or with sensors, actuators and the like across any type of serial and/or parallel data links. Today, data processing components within a vehicle are commonly interlinked by a data communications network such as a controller area network (CAN), an example of which is described in ISO Standard 11898-1 (2003).

Because vehicles now process relatively large amounts of digital data during operation, it can be an engineering challenge to ensure that the data processed is accurate and reliable. Though unlikely, it is postulated that as digital data is stored, processed, consumed and/or shared between or within the various data processing components of a vehicle, for example, bit errors and the like can occur due, for example, to environmental factors, hardware faults, data transmission issues and other postulated causes. As a result, various techniques have been developed to ensure the integrity of data processed and transferred within the vehicle.

Nevertheless, it remains desirable to formulate systems and methods for ensuring data security within vehicle control systems, including the identification of potential linked data security errors. Other desirable features and characteristics will become apparent from the subsequent detailed description and the appended claims, taken in conjunction with the accompanying drawings and the foregoing technical field and background

SUMMARY OF THE INVENTION

A method and apparatus is provided for detecting random access memory (RAM) failure for data with a plurality of addresses. In one embodiment, and by way of example only, the method comprises generating a plurality of RAM test patterns in a predetermined order, implementing a RAM test pattern on each data address in an initial testing pass, based on the predetermined order of the RAM test patterns, rotating the RAM test patterns sequentially to prepare for a new testing pass, and implementing the RAM test patterns on different data addresses in the new testing pass.

In another embodiment, and by way of example only, the method comprises generating a plurality of sets of the RAM test patterns, grouping the plurality of data addresses into sets, assigning each RAM test pattern set to one or more corresponding data address sets, and implementing each RAM test pattern set on its one or more corresponding data address sets. Each RAM test pattern set comprises two complementary RAM test patterns. Each data address set comprises two different data addresses.

In one embodiment, and by way of example only, the apparatus comprises means for generating a plurality of RAM test patterns in a predetermined order, means for implementing a RAM test pattern on each data address in an initial testing pass, based on the predetermined order of the RAM test patterns, means for rotating the RAM test patterns sequentially to prepare for a new testing pass, and means for implementing the RAM test patterns on different data addresses in the new testing pass.

DESCRIPTION OF THE DRAWINGS

The present invention will hereinafter be described in conjunction with the following drawing figures, wherein like numerals denote like elements.

FIG. 3 depicts one implementation of the RAM test process of FIG. 2, applied to a long word structure;

FIG. 4 depicts another implementation of the RAM test process of FIG. 2, applied to a word structures;

FIG. 5 depicts another implementation of the RAM test process of FIG. 2, applied to a byte structure;

FIG. 6 depicts another implementation of the RAM test process of FIG. 2 applied to a byte structure;

FIG. 8 depicts one implementation of the RAM test process of FIG. 7, applied to a long word structure;

FIG. 9 depicts another implementation of the RAM test process of FIG. 7, applied to a word structures;

FIG. 10 depicts another implementation of the RAM test process of FIG. 7, applied to a long word structure; and FIG. 11 depicts another implementation of the RAM test process of FIG. 7, applied to a byte structure.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
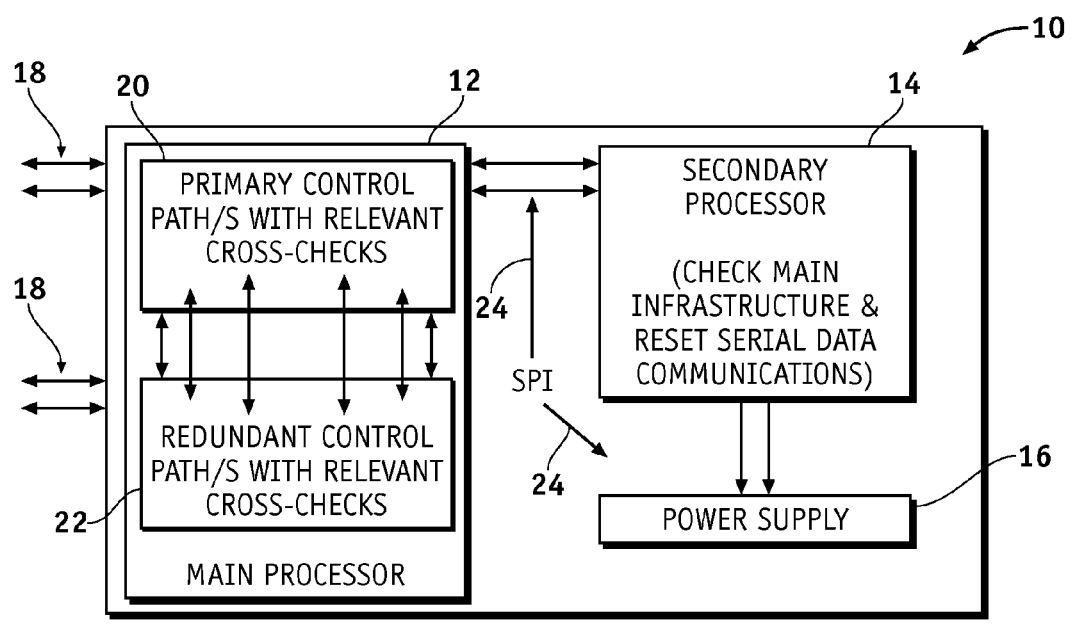
FIG. 1 depicts an exemplary control system 10 for processing and transmitting data in a vehicle.

FIG. 1 depicts an exemplary control system 10 for processing and transmitting data in a vehicle. The system 10 includes a main processor 12, a secondary processor 14, a power supply 16, and one or more links 18. The control system 10 may be used for redundant processing for vehicle systems or elements thereof.

As shown in FIG. 1, the main processor 12 preferably has one or more primary control paths 20, and one or more redundant control paths 22. The primary control path(s) 20 and the redundant control path(s) 22 preferably utilize random access memory (RAM) in connection with various cross-checks, in order to help detect and mitigate any postulated errors in the control system 10. The configuration of the main processor 12, with the primary control path(s) 20 and the redundant control path(s) 22, allows the main processor 12 to conduct such redundant processing and cross-checks, with or without the presence of the second processor 14. The control system 10 preferably also includes a power supply 16 coupled to, and which provides power to the main processor 12 and/or the secondary processor 14.

The second processor 14 is coupled to the main processor 12, and can help check the main infrastructure of the main processor 12, and/or reset data values from the main processor 12. The second processor 14 also preferably can re-set the main processor 12 when appropriate, independent of the power supply 16. The main processor 12 is preferably in operable communication with the secondary processor 14 via a connection 24. As depicted in FIG. 1, in a preferred embodiment the connection 24 includes a serial peripheral interface (SPI). However, it will be appreciated that the connection 24 can include any of a number of different types of connections, such as, by way of example only, various other types of serial, parallel, wireless or other data communication media.

As noted above, it will be appreciated that in certain embodiments the control system 10 may not include a secondary processor 14. In such embodiments, the redundant processing and related cross-checks can be conducted exclusively by the main processor 12.

In various embodiments, the links 18 can include a control area network (CAN), a local area network (LAN), and/or any one of a number of other types of data network connections. The links 18 are preferably configured to transmit data and/or other communications between the control system 10 and one or more receiving modules of the vehicle (not depicted).

In various embodiments, increased security and data integrity is implemented by the control system 10 through the use of the primary and redundant control paths 20, 22 of the main processor 10. For example, the above-referenced cross-checks can be used to detect and mitigate incorrect operations, which can be reflected in either individual or linked errors in the data processed by the main processor 12.

Figure 2:
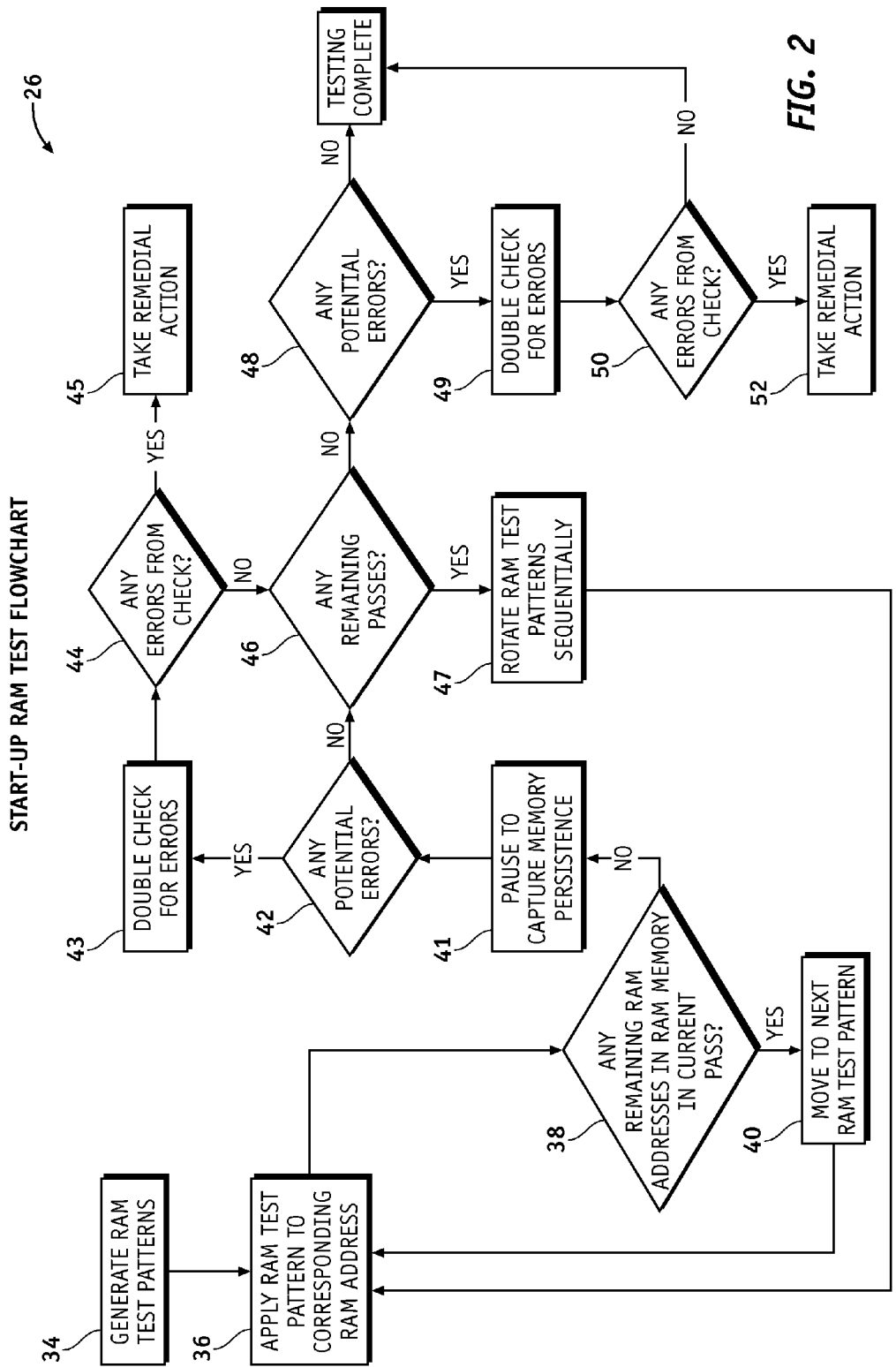
FIG. 2 depicts an embodiment for a first RAM test process.

An embodiment of a first RAM test process 26 is depicted in FIG. 2. Before describing the depicted process in more detail, and with reference to FIG. 3, it is noted that the first RAM test process 26 preferably applies a plurality of RAM test ordered patterns 28 to corresponding RAM addresses 30 through a plurality of test passes 32. Preferably, each test pass 32 is designed to detect all known low persistence and linked memory faults, and can be executed in approximately forty milliseconds.

Turning now to FIG. 2, in step 34 the above-mentioned RAM test ordered patterns 28 are generated, so that they can be applied in a first test pass 32. The RAM test ordered patterns 28 preferably are utilized in connection with one, two, four, or eight corners of memory, and are generated in a manner, such as that depicted in FIG. 3, configured to detect single bit, adjacent bit, nibble, byte, and word errors for internal RAM.

Next, in step 36, each RAM test ordered pattern 28 is applied to a corresponding RAM address 30. For example, in the particular implementation of FIG. 3, the first RAM test ordered pattern 28, namely 55555555, is applied to the first RAM address 30, namely x0. In step 38, it is determined whether or not there are any remaining RAM addresses 30 for the current test pass 32 in any of the RAM memory. If it is determined in step 38 that there are remaining RAM addresses 30 to be tested in the current test pass 32 in any of the RAM memory, then, in step 40, the process moves to the next RAM test ordered pattern 28, and repeats step 36 accordingly.

Steps 36-40 repeat until each of the RAM addresses 30 have been tested in the current test pass 32. Assuming that the number of RAM addresses 30 exceeds the number of RAM test ordered patterns 28, once each of the RAM test ordered patterns 28 have been used in a particular test pass 32, then the RAM test ordered patterns 28 repeat, beginning with the first RAM test ordered pattern 28 for the particular test pass 32. Preferably the RAM test ordered patterns 28 are sequentially repeated within a given test pass 32 for every "X" RAM addresses 30, where "X" is the number of RAM test ordered patterns 28. Preferably, in order to better capture potential linked and persistent memory errors, the number of RAM test ordered patterns 28 is not a multiple of 8. For example, in the embodiment of FIG. 3 featuring twelve RAM test ordered patterns 28, the RAM test ordered patterns 28 are preferably sequentially repeated for every twelve RAM addresses 30.

Specifically, in the embodiment depicted in FIG. 3, in the first test pass 32: the 55555555 RAM test ordered pattern 28 is applied to the following RAM addresses 30: x0, x12, x24, x36, and so on; the 33333333 RAM test ordered pattern 28 is applied to the following RAM addresses 30: x1, x13, x25, x37, and so on; the 66666666 RAM test ordered pattern 28 is applied to the following RAM addresses 30: x2, x14, x26, x38, and so on; the F0F0F0F0 RAM test ordered pattern 28 is applied to the following RAM addresses 30: x3, x15, x27, x39, and so on; the 00FF00FF RAM test ordered pattern 28 is applied to the following RAM addresses 30: x4, x16, x28, x40, and so on; the FFFF0000 RAM test ordered pattern 28 is applied to the following RAM addresses 30: x5, x17, x29, x41, and so on; the 0000FFFF RAM test ordered pattern 28 is applied to the following RAM addresses 30: x6, x18, x30, x42, and so on; the FF00FF00 RAM test ordered pattern 28 is applied to the following RAM addresses 30: x7, x19, x31, x43, and so on; the 0F0F0F0F RAM test ordered pattern 28 is applied to the following RAM addresses 30: x8, x20, x32, x44, and so on; the 99999999 RAM test ordered pattern 28 is applied to the following RAM addresses 30: x9, x21, x33, x45, and so on; the CCCCCCCC RAM test ordered pattern 28 is applied to the following RAM addresses 30: x10, x22, x34, x46, and so on; and the AAAAAAAA RAM test ordered pattern 28 is applied to the following RAM addresses 30: x11, x23, x35, x47, and so on, before it is determined in step 38 that the first test pass 32 is complete.

As shown in the exemplary embodiment of FIG. 3, preferably the RAM test ordered patterns 28 are arranged so that RAM test ordered patterns 28 next to one another are only complementary on the single bit or half structure levels, in order to better capture potential linked and persistent errors. For example, as shown in FIG. 3, the 55555555 RAM test ordered pattern 28 is next to the AAAAAAAA RAM test ordered pattern 28 and the FFFF0000 RAM test ordered pattern 28 is next to the 0000FFFF RAM test ordered pattern 28; however, the CCCCCCCC RAM test ordered pattern 28 and the 33333333 RAM test ordered pattern 28 are not next to one other, and the 66666666 RAM test ordered pattern 28 and the 99999999 RAM test ordered pattern 28 are not next to one another.

Returning now to FIG. 2, once it has been determined in step 38 that there are no remaining RAM addresses 30 to be tested in the current test pass 32, then the process proceeds to step 41. In step 41, there is an optional pause to capture memory persistence. Specifically, if sufficient memory persistence time has not elapsed as of the completion of step 38, then preferably, in step 41, there is a pause sufficient to complete the memory persistence time, in order to more accurately account for any persistent errors in memory. It will be appreciated that the memory persistence time is approximately 10 milliseconds in certain applications, but that the memory persistence time can vary in different applications.

Next, in step 42, it is determined whether or not there have been any potential errors in the process, such as any bit errors or other data errors detected by the application of the RAM test ordered patterns 28 in step 36. In a preferred embodiment, the values are examined in reverse order, and multiple checksums and/or other measures are utilized to check for any errors in the current test pass 32.

If there are no potential errors detected in step 42, then the process proceeds to step 46, in which it is determined whether there are any remaining test passes 32, as will be described further below. Alternatively, if there are any potential errors detected in step 42, then a double-check for potential errors is performed in step 43, for example by re-running steps 36-40 for the current test pass 32. Next, in step 44, it is determined whether or not any errors were detected in the double check of step 43. If the double check in step 43 does not reveal an error, then the process proceeds to step 46, and the process may optionally keep a record of the original potential error, so that appropriate corrective measures can be taken in the event that it resurfaces in a subsequent test pass 32. Alternatively, if the double check in step 43 reveals an error, then, in step 45, immediate appropriate remedial action is preferably taken. Such remedial action in step 45 may include reduced reliance on the RAM memory, repair of the RAM memory, disabling all or a portion of the control system 10, and/or any one of a number of other potential measures.

In step 46, it is determined whether or not there are any remaining test passes 32. If it is determined in step 46 that there are one or more remaining test passes 32, then the process proceeds to step 47 to begin a new test pass 32, as discussed below. Otherwise, the process proceeds to step 48 to check again for any potential errors, preferably across each of the test passes 32, as described further below.

In step 47, the RAM test ordered patterns 28 are rotated sequentially, and the process returns to step 36, so that a different RAM test ordered pattern 28 is applied to each individual RAM address 30 in the subsequent test pass 32. Steps 36-40 are then repeated for each of the RAM test ordered patterns 28 in this subsequent test pass 32. Once this subsequent test pass 32 is completed, and it is determined in step 46 that there is at least one remaining test pass 32, step 47 begins anew with another test pass 32, until each of the test passes 32 are completed, as determined in step 46.

For example, in the particular implementation depicted in FIG. 3, in the second test pass 32 the AAAAAAAA RAM test ordered pattern 28 is applied to the following RAM addresses 30: x0, x12, x24, x36, and so on; the 55555555 RAM test ordered pattern 28 is applied to the following RAM addresses 30: x1, x13, x25, x37, and so on; the 33333333 RAM test ordered pattern 28 is applied to the following RAM addresses 30: x2, x14, x26, x38, and so on; the 66666666 RAM test ordered pattern 28 is applied to the following RAM addresses 30: x3, x15, x27, x39, and so on; the F0F0F0F0 RAM test ordered pattern 28 is applied to the following x4 RAM addresses 30: x4, x16, x28, x40, and so on; the 00FF00FF RAM test ordered pattern 28 is applied to the following RAM addresses 30: x5, x17, x29, x41, and so on; the FFFF0000 RAM test ordered pattern 28 is applied to the following RAM addresses 30: x6, x18, x30, x42, and so on; the 0000FFFF RAM test ordered pattern 28 is applied to the following RAM addresses 30: x7, x19, x31, x43, and so on; the FF00FF00 RAM test ordered pattern 28 is applied to the following RAM addresses 30: x8, x20, x32, x44, and so on; the 0F0F0F0F RAM test ordered pattern 28 is applied to the following RAM addresses 30: x9, x21, x33, x45, and so on; the 99999999 RAM test ordered pattern 28 is applied to the following RAM addresses 30: x10, x22, x34, x46, and so on; and the CCCCCCCC RAM test ordered pattern 28 is applied to the following RAM addresses 30: x11, x23, x35, x47, and so on.

Similar rotations are made for subsequent test passes 32 in the particular implementation of FIG. 3, until, in the twelfth and final pass, the 33333333 RAM test ordered pattern 28 is applied to the following RAM addresses 30: x0, x12, x24, x36, and so on; the 66666666 RAM test ordered pattern 28 is applied to the following RAM addresses 30: x1, x13, x25, x37, and so on; the F0F0F0F0 RAM test ordered pattern 28 is applied to the following RAM addresses 30: x2, x14, x26, x38, and so on; the 00FF00FF RAM test ordered pattern 28 is applied to the following RAM addresses 30: x3, x15, x27, x39, and so on; the FFFF0000 RAM test ordered pattern 28 is applied to the following RAM addresses 30: x4, x16, x28, x40, and so on; the 0000FFFF RAM test ordered pattern 28 is applied to the following RAM addresses 30: x5, x17, x29, x41, and so on; the FF00FF00 RAM test ordered pattern 28 is applied to the following RAM addresses 30: x6, x18, x30, x42, and so on; the 0F0F0F0F RAM test ordered pattern 28 is applied to the following RAM addresses 30: x7, x19, x31, x43, and so on; the 99999999 RAM test ordered pattern 28 is applied to the following RAM addresses 30: x8, x20, x32, x44, and so on; the CCCCCCCC RAM test ordered pattern 28 is applied to the following RAM addresses 30: x9, x21, x33, x45, and so on; the AAAAAAAA RAM test ordered pattern 28 is applied to the following RAM addresses 30: x10, x22, x34, x46, and so on, and the 55555555 RAM test ordered pattern 28 is applied to the following RAM addresses 30: x11, x23, x35, x47, and so on.

Preferably, different test passes 32 will be performed until each of the RAM test ordered patterns 28 are applied to each of the RAM addresses 30. Once it is determined in step 46 that there are no remaining passes 32, then the process proceeds to step 48 to check for any potential errors, as set forth below.

In step 48, it is determined whether or not there have been any potential errors in the process across each of the test passes 32, such as any bit errors or other data errors detected by the application of the RAM test ordered patterns 28 in step 36. In a preferred embodiment, the values are examined in reverse order, and multiple checksums and/or other measures are utilized to check for any errors in each test pass 32.

If there are no potential errors, the testing is complete. If there are any potential errors detected in step 48, then a double-check for potential errors is performed in step 49, for example by re-running steps 36-40 for any particular test passes 32 experiencing a potential error. Next, in step 50, it is determined whether or not any errors were detected in the double check of step 49. If the double check in step 49 does not reveal an error, then the testing is complete. Alternatively, if the double check in step 49 reveals an error, then, in step 52, appropriate remedial action may be taken. Such remedial action in step 52 may include reduced reliance on the RAM memory, repair of the RAM memory, disabling all or a portion of the control system 10, and/or any one of a number of other potential measures.

As mentioned above, the RAM test ordered patterns 28 depicted in FIG. 3 are designed to detect potential single bit, adjacent bit, nibble, byte, word, and double word low persistence and permanent errors for internal RAM, among other potential errors. The order of the RAM test ordered patterns 28 is designed to minimize the potential occurrence of zeros and ones in consecutive RAM addresses 30. Because each test pass 32 is preferably conducted in approximately 40 milliseconds or less, the entire first RAM test process 26 can preferably be conducted in less than one second.

Moreover, the use of the multiple test passes 32 for these RAM test ordered patterns 28 facilitates testing and mitigation of potential linked errors in the internal RAM. This particular implementation is particularly well suited for use as a start-up RAM test having a single microprocessor, namely the main processor 12. In addition, this process may also be applied to external RAM, if desired.

The particular implementation of the first RAM test process 26 shown in FIG. 3 includes twelve RAM test ordered patterns 28 applied to a long word structure. However, it will be appreciated that the first RAM test process 26 can use a different number of patterns applied to different data implementations, for example a ten pattern approach to a word structure (depicted in FIG. 4), an eight pattern approach to a byte structure (depicted in FIG. 5), and a nine pattern approach to a byte structure (depicted in FIG. 6), each with similar benefits as those described in connection with FIG. 3 above, among any one of a number of other different possible implementations. As mentioned above, preferable the number of patterns is not a multiple of eight, on order to more accurately capture potential linked or persistent memory errors. Accordingly, FIG. 6 depicts a preferred embodiment with an extra pattern inserted therein, so as to avoid having a multiple of eight patterns as depicted in FIG. 5.

As shown in FIGS. 4-6, the RAM test ordered patterns 28 may differ depending on the application of the first RAM test process 26. For example, the FFFF0000 and 0000FFFF RAM test ordered patterns 28 are preferably omitted for certain applications other than long word structures, such as word structures and byte structures, as shown in FIGS. 4-6. Also, as shown in FIG. 6, in applications of the RAM test process 26 to byte structures, preferably a pseudo pattern, such as a 00 or FF RAM test ordered pattern 28, is added to the middle of the eight other RAM test ordered patterns 28 depicted in FIG. 6, so that the RAM test process 26 can detect up to eight possible data errors.

Figure 7:
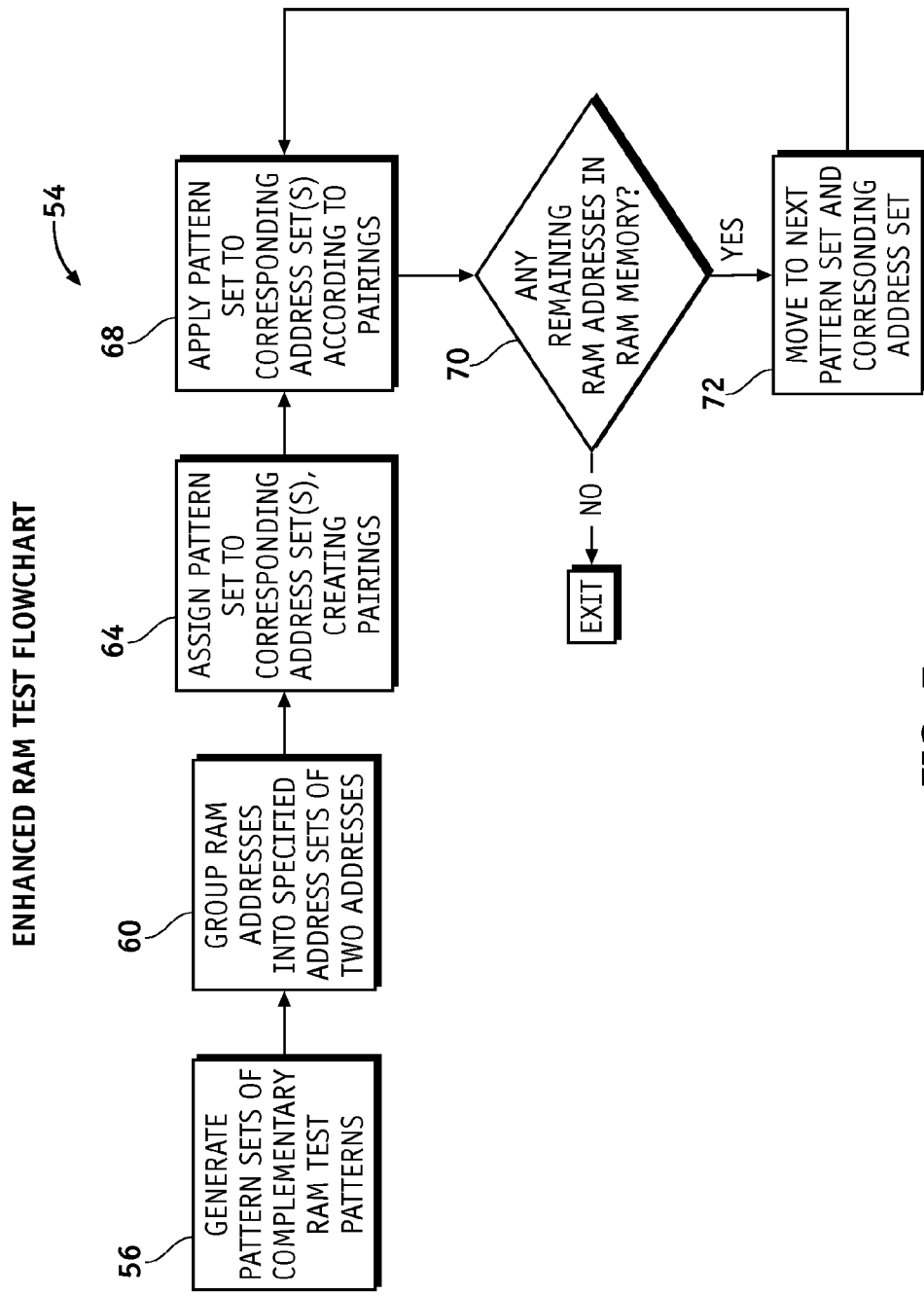
FIG. 7 depicts an embodiment for a second RAM test process.

Turning now to FIGS. 7-8, an embodiment is shown for a second RAM test process 54, which, similar to the first RAM test process 26 (and as depicted in FIG. 8), uses a plurality of RAM test ordered patterns 28 and RAM addresses 30. First, in step 56, pattern sets 58 are created from the RAM test ordered patterns 28. Preferably, each pattern set 58 will include two RAM test ordered patterns 28 that are complements of another. Most preferably, each pattern set 58 will include two RAM test ordered patterns 28 such that, when corresponding values from the two RAM test ordered patterns 28 in the pattern set are added together, the sum on a per nibble basis is equal to the "F" value of the hexadecimal numeric system.

For example, in the particular implementation of the second RAM test process 54 shown in FIG. 8, the 55555555 and AAAAAAAA RAM test ordered patterns 28 form one pattern set 58, the 99999999 and 66666666 RAM test ordered patterns 28 form another pattern set 58, the 33333333 and CCCCCCCC RAM test ordered patterns 28 form another pattern set 58, the F0F0F0F0 and 0F0F0F0F RAM test ordered patterns 28 form another pattern set 58, the 00FF00FF and FF00FF00 test ordered patterns 28 form another pattern set 58, and the FFFF0000 and 0000FFFF RAM test ordered patterns 28 form another pattern set 58.

Next, in step 60, the RAM addresses 30 are grouped together in pairs, thereby creating RAM address sets 62, each with two RAM addresses 30. For example, in the particular implementation of FIG. 8, the x0 and x1 RAM addresses 30 form one RAM address set 62, the x2 and x3 RAM addresses 30 form another RAM address set 62, the x4 and x5 RAM addresses 30 form another RAM address set 62, the x6 and x7 RAM addresses 30 form another RAM address set 62, the x8 and x9 RAM addresses 30 form another RAM address set 62, and the x10 and x11 RAM addresses 30 form another RAM address set 62.

Next, in step 64, the pattern sets 58 are each assigned a specific RAM address set 62, thereby creating pairings 66. For example, in the particular implementation depicted in FIG. 8, one pairing 66 includes the pattern set 58 of 55555555 and AAAAAAAA, paired with the RAM address set 62 of x0 and x1, and so on, as set forth in FIG. 8.

Next, in step 68, the first pattern set 58 is applied to a first corresponding RAM address set 62, according to the pairings 66 as determined in step 64, before proceeding to step 70 below. Next, in step 70, it is determined whether or not there are any remaining RAM address sets 62. If it is determined in step 70 that there are remaining RAM address sets 62, then, in step 72, the process moves to the next pattern set 58 and the next corresponding RAM address set 62, and the process repeats step 68 accordingly.

Steps 68-72 repeat until each of the RAM address sets 62 have been tested. Assuming that the number of RAM address sets 62 exceeds the number of pattern sets 58, once each of the pattern sets 58 have been used, then the pattern sets 58 repeat, beginning with the first pattern set 58 and the next corresponding RAM address set 62 according to the pairings 66 as determined in step 64. Preferably the pattern sets 58 are sequentially repeated for every "Y" RAM address sets 62, where "Y" is the number of pattern sets 62. For example, in the embodiment of FIG. 8 featuring six pattern sets 58 (comprising twelve RAM test ordered patterns 28), the pattern sets 58 are preferably sequentially repeated for every six RAM address sets 62 (comprising twelve RAM addresses 30). Unlike the first RAM test process 26, the second RAM test process 54 does not require implementation of multiple test passes.

The second RAM test process 54 can help detect potential single bit, adjacent bit, nibble, byte, word, and extended word errors, among various other types of potential errors, while using a reduced number of addresses to be stored in the RAM memory. The configuration of the second RAM test process 54, particularly using the pattern sets 58 of complementary RAM test ordered patterns 28, can be especially useful in detecting potential permanent errors, and for use while driving after the vehicle has started up. The second RAM test process 54 is also advantageous in that it can be used in situations when dual path memory strategies cannot be used.

The particular implementation of the second RAM test process 54 shown in FIG. 8 includes twelve RAM test ordered patterns 28, applied to a long word structure. However, it will be appreciated that the second RAM test process 54 can use a different number of patterns applied to different data implementations, for example a ten pattern approach applied to a word structure (depicted in FIG. 9), an alternative twelve bit pattern approach applied to a long word structure (depicted in FIG. 10), and an eight pattern approach applied to a byte structure (depicted in FIG. 11), each with similar benefits as those described in connection with FIG. 8 above, among any one of a number of other different possible implementations.

In one preferred implementation, the first and second RAM test processes 26, 54 can be used in tandem, for optimal detection of potential errors. Preferably the second RAM test process 54 uses the same RAM test ordered patterns 28 that are used in the first RAM test process 26, as shown in FIGS. 4-6 and 8-11. Most preferably, the first RAM test process 26 is used during start-up of the vehicle, and the second RAM test process 54 is subsequently used after start-up and while the vehicle is in operation.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method executable by a processor to detect random access memory (RAM) failure for data with a plurality of addresses, the method comprising the steps of:
   generating a plurality of RAM test patterns in a predetermined order using the processor;
   applying, using the processor, each RAM test pattern to one of the plurality of addresses in an initial testing pass, based on the predetermined order of the RAM test patterns;
   rotating the RAM test patterns sequentially; and
   applying each of the rotated RAM test patterns to a different data address in a new testing pass using the processor.

2. The method of claim 1, further comprising:
   repeating the rotating and the applying of the rotated RAM test patterns until each RAM test pattern has been implemented on each data address.

3. The method of claim 1, further comprising:
   conducting a first check for errors in one or more of the testing passes; and
   conducting one or more second checks for errors in one or more of the testing passes, if the first check indicates an error.

4. The method of claim 1, wherein:
   the predetermined order of the RAM test patterns is such that each RAM test pattern may only be complementary on a single bit or half structure level to an immediately prior or subsequent RAM test pattern in the predetermined order.

5. The method of claim 1, wherein:
   at least one of the RAM test patterns has a plurality of nibbles each having "5" values; and
   at least one of the RAM test patterns has a plurality of nibbles each having "A" values.

6. The method of claim 5, wherein:
   at least one of the RAM test patterns has a plurality of nibbles each having "5" values;
   at least one of the RAM test patterns has a plurality of nibbles each having "A" values;
   at least one of the RAM test patterns has a plurality of nibbles each having "3" values;
   at least one of the RAM test patterns has a plurality of nibbles each having "6" values;
   at least one of the RAM test patterns has a plurality of nibbles with alternating "F" and "0" values, beginning with an "F" value;
   at least one of the RAM test patterns has a plurality of nibbles with alternating "0" and "F" values, beginning with a "0" value;
   at least one of the RAM test patterns has a plurality of nibbles each having "9" values; and
   at least one of the RAM test patterns has a plurality of nibbles each having "C" values.

7. The method of claim 1, wherein:
   at least one of the RAM test patterns has a plurality of nibbles each having "9" values; and
   at least one of the RAM test patterns has a plurality of nibbles each having "6" values.

8. The method of claim 1, wherein:
   at least one of the RAM test patterns has a plurality of nibbles with alternating "F" and "0" values, beginning with an "F" value; and
   at least one of the RAM test patterns has a plurality of nibbles with alternating "O" and "F" values, beginning with a "0 value.

9. The method of claim 1, wherein:
   at least one of the RAM test patterns has a plurality of nibbles each having "3" values; and
   at least one of the RAM test patterns has a plurality of nibbles each having "C" values.

10. The method of claim 1, further comprising:
    generating a plurality of sets of the RAM test patterns, each RAM test pattern set comprising two complementary RAM test patterns;
    grouping the plurality of data addresses into sets, each data address set comprising two different data addresses;
    assigning each RAM test pattern set to one particular corresponding data address set; and
    implementing each RAM test pattern set on its corresponding data address set.

11. A method executable by a processor in a vehicle to detect memory faults in a random access memory (RAM) comprising a plurality of addresses, the method comprising:
    during startup of the RAM:
       generating a plurality of RAM test patterns in a predetermined order using the processor;
       applying, using the processor, each RAM test pattern to one of the plurality of addresses in an initial testing pass based on the predetermined order of the RAM test patterns;
       rotating the RAM test patterns sequentially; and
       applying each of the rotated RAM test patterns with the processor to a different one of the plurality of addresses in a new testing pass; and
    during operation of the vehicle:
       generating a plurality of sets of RAM test patterns with the processor, each RAM test pattern set comprising two complementary RAM test patterns;
       grouping the plurality of data addresses into sets, each data address set comprising two different data addresses;
       assigning each RAM test pattern set to one or more corresponding data address sets; and
       applying each RAM test pattern set to its corresponding one or more data address sets using the processor.

12. The method of claim 11, wherein each of the RAM test pattern sets includes two RAM test patterns such that, when corresponding values from the two RAM test patterns in the RAM test pattern set are added together, the sum on a per nibble basis is equal to the "F" value of the hexadecimal numeric system.

13. The method of claim 11, wherein at least one of the RAM test pattern sets includes:
   a RAM test pattern having a plurality of nibbles each having "5" values; and
   a complementary RAM test pattern having a plurality of nibbles each having "A" values.

14. The method of claim 11, wherein at least one of the RAM test pattern sets includes:
   a RAM test pattern having a plurality of nibbles each having "9" values; and
   a complementary RAM test pattern having a plurality of nibbles each having "6" values.

15. The method of claim 11, wherein at least one of the RAM test pattern sets includes:
   a RAM test pattern having a plurality of nibbles each having "3" values; and
   a complementary RAM test pattern having a plurality of nibbles each having "C" values.

16. The method of claim 11, wherein at least one of the RAM test pattern sets includes:
   a RAM test pattern having a plurality of nibbles with alternating "F" and "0" values, beginning with an "F" value; and
   a complementary RAM test pattern having a plurality of nibbles with alternating "0" and "F" values, beginning with a "0" value.

17. The method of claim 11, wherein:
   at least one of the RAM test pattern sets includes:
      a RAM test pattern having a plurality of nibbles each having "5" values; and
      a complementary RAM test pattern having a plurality of nibbles each having "A" values;
   at least one of the RAM test pattern sets includes:
      a RAM test pattern having a plurality of nibbles each having "9" values; and
      a complementary RAM test pattern having a plurality of nibbles each having "6" values;
   at least one of the RAM test pattern sets includes:
      a RAM test pattern having a plurality of nibbles each having "3" values; and
      a complementary RAM test pattern having a plurality of nibbles each having "C" values; and
   at least one of the RAM test pattern sets includes:
      a RAM test pattern having a plurality of nibbles with alternating "F" and "0" values, beginning with an "F" value; and
      a complementary RAM test pattern having a plurality of nibbles with alternating "0" and "F" values, beginning with a "0" value.

18. A system comprising:
   a control path implemented in a random access memory having a plurality of addresses; and
   a processor configured generating a plurality of RAM test patterns in a predetermined order, to apply each RAM test pattern to one of the plurality of addresses in an initial testing pass based on the predetermined order of the RAM test patterns, to rotate the RAM test patterns sequentially, and to apply each of the rotated RAM test patterns to a different one of the plurality of addresses in a new testing pass.

19. The system of claim 18 wherein the processor is configured to repeat the rotating and applying of the rotated RAM test patterns until each RAM test pattern has been implemented on each of the plurality of data addresses.

20. The system of claim 19 wherein the processor is further configured to conduct a first check for errors in one or more of the testing passes and to conduct one or more second checks for errors in one or more of the testing passes, if the first check indicates an error.

* * * * *